(12) United States Patent
Krawczyk et al.

(10) Patent No.: US 7,344,994 B2
(45) Date of Patent: Mar. 18, 2008

(54) MULTIPLE LAYER ETCH STOP AND ETCHING METHOD

(75) Inventors: John W. Krawczyk, Richmond, KY (US); Andrew L. McNees, Lexington, KY (US); Christopher J. Money, Lexington, KY (US); Girish S. Patil, Lexington, KY (US); David B. Rhine, Georgetown, KY (US); Karthik Vaideeswaran, Troy, NY (US)

(73) Assignee: Lexmark International, Inc., Lexington, KY (US)

( * ) Notice: Subject to any disclaimer, the term of this patent is extended or adjusted under 35 U.S.C. 154(b) by 342 days.

(21) Appl. No.: 11/063,108

(22) Filed: Feb. 22, 2005

(65) Prior Publication Data
US 2006/0189144 A1    Aug. 24, 2006

(51) Int. Cl.
*H01L 21/302* (2006.01)
*H01L 21/461* (2006.01)

(52) U.S. Cl. .............................. 438/710; 257/E21.597; 438/712; 438/735

(58) Field of Classification Search ........ 257/E21.597; 438/712, 719, 710, 745, 458, 735
See application file for complete search history.

(56) References Cited

U.S. PATENT DOCUMENTS

| | | | |
|---|---|---|---|
| 5,500,279 A | 3/1996 | Walter et al. | |
| 5,960,313 A | 9/1999 | Jun | |
| 7,052,927 B1 * | 5/2006 | Fletcher et al. | 438/57 |
| 2001/0013638 A1 | 8/2001 | Lam et al. | |
| 2002/0086456 A1 * | 7/2002 | Cunningham et al. | 438/57 |
| 2002/0145179 A1 | 10/2002 | Lam et al. | |
| 2003/0207586 A1 | 11/2003 | Lam et al. | |
| 2004/0137698 A1 | 7/2004 | Taraschi et al. | |

FOREIGN PATENT DOCUMENTS

JP    2001-353700    12/2001

* cited by examiner

*Primary Examiner*—Caridad Everhart
(74) *Attorney, Agent, or Firm*—Luedeka, Neely & Graham PC

(57) ABSTRACT

A process for etching semiconductor substrates using a deep reactive ion etching process to produce through holes or slots (hereinafter "slots") in the substrates. The process includes applying a first layer to a back side of a substrate as a first etch stop material. The first layer is a relatively soft etch stop material. A second layer is applied to the first layer on the back side of the substrate to provide a composite etch stop layer. The second layer is a relatively hard etch stop material. The substrate is etched from a side opposite the back side of the substrate to provide a slot in the substrate.

20 Claims, 7 Drawing Sheets

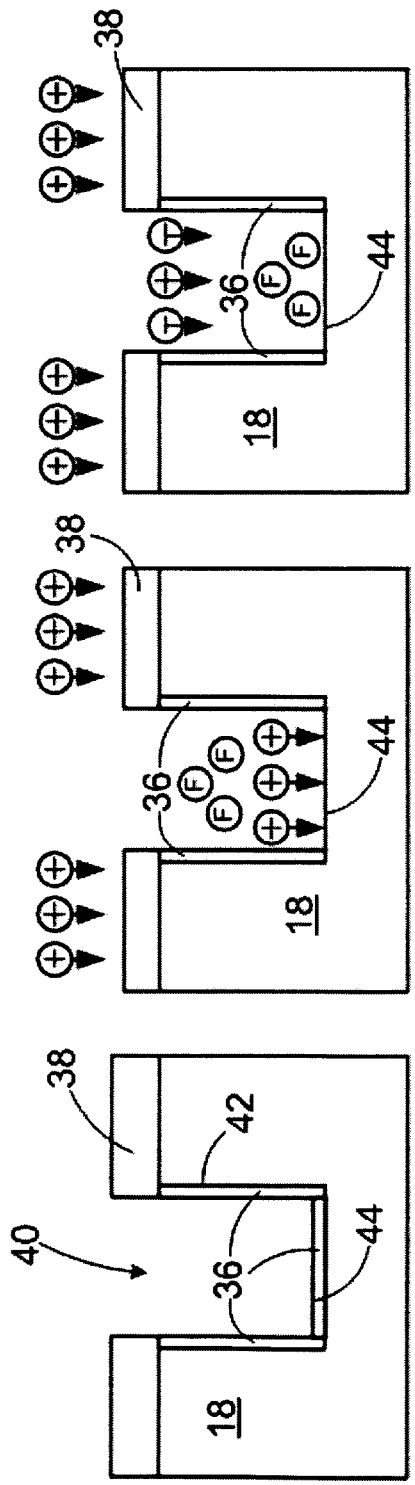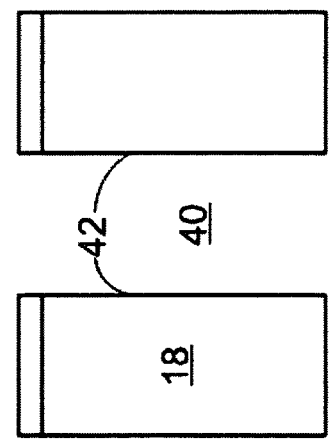

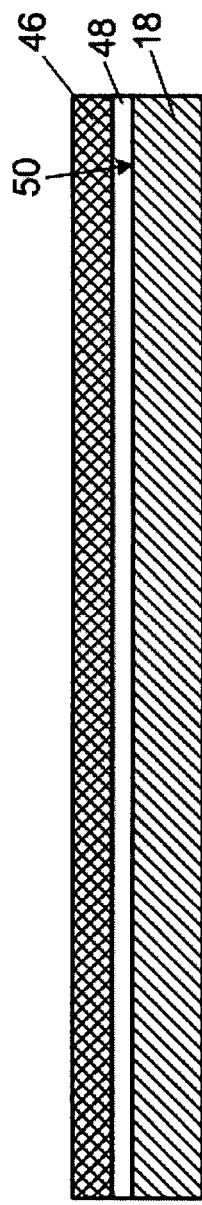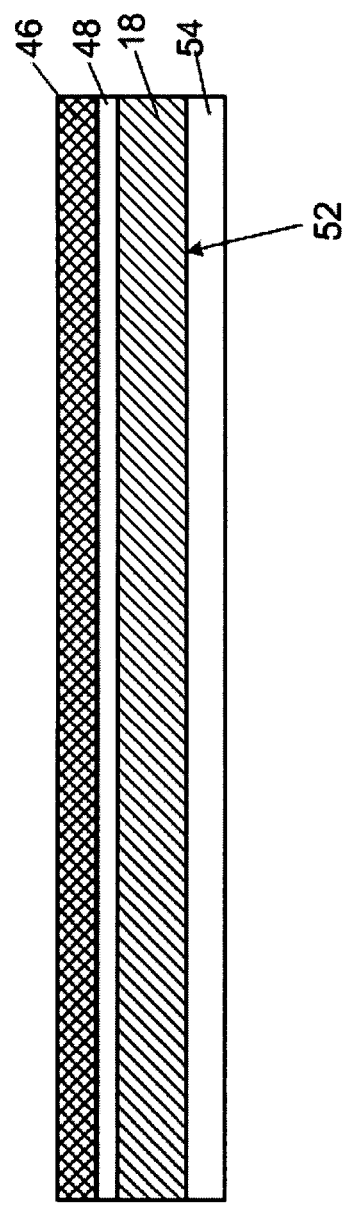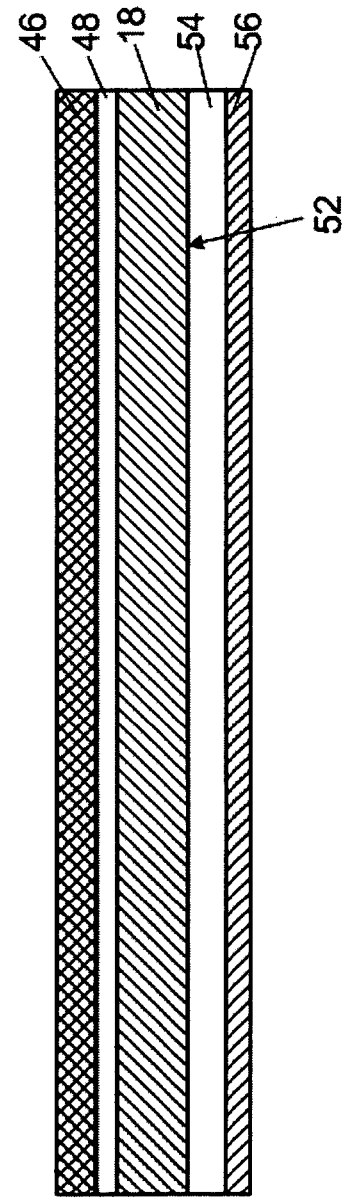

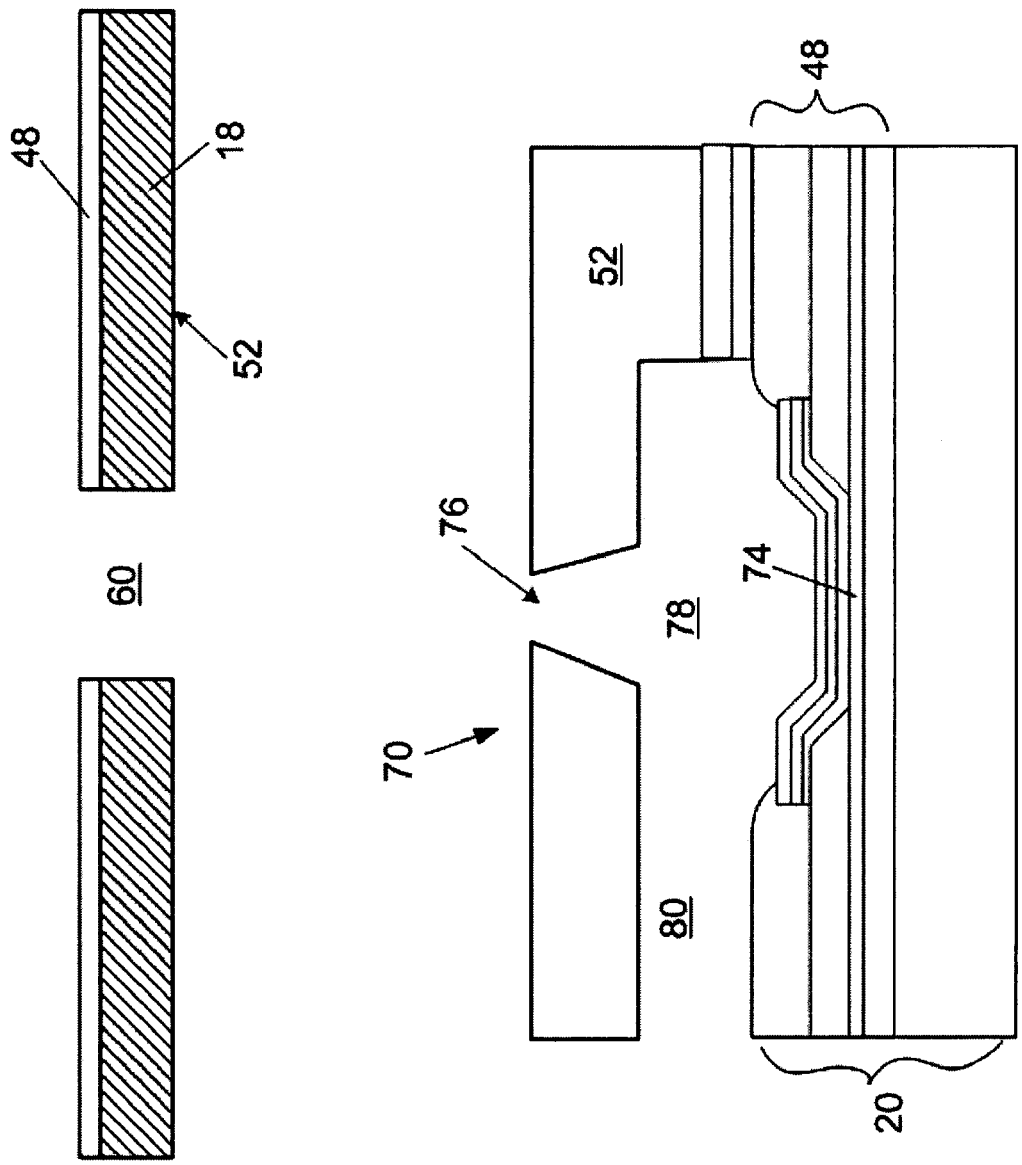

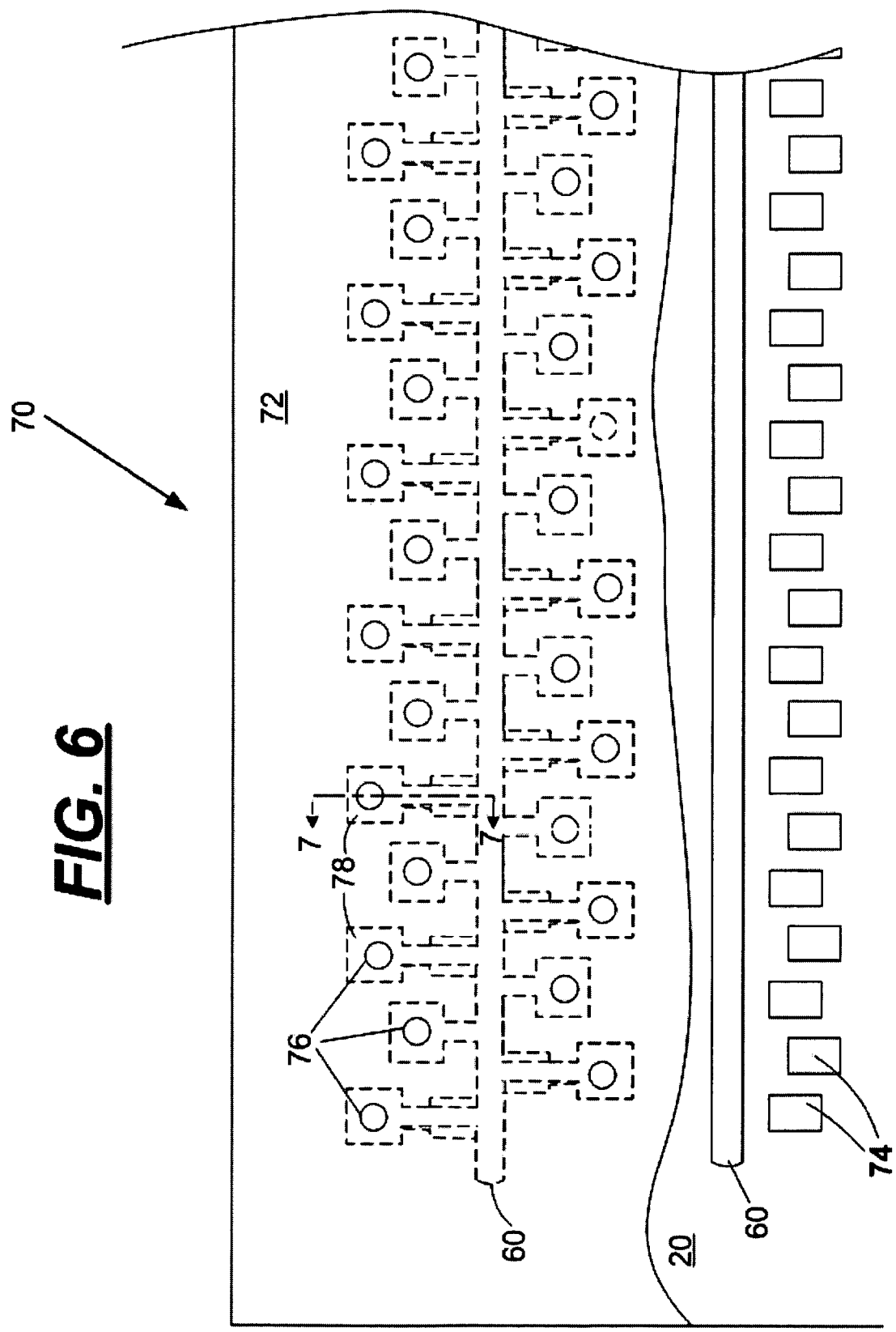

MULTIPLE LAYER ETCH STOP AND ETCHING METHOD

FIELD OF THE DISCLOSURE

The disclosure relates to etching processes and in particular improvements in deep reactive ion etching processes.

BACKGROUND AND SUMMARY

During deep reactive ion etching (DRIE) of wafers of semiconductor substrate, the wafers are positioned and held in place on an electrostatic clamping disk. The clamping disk uses a DC power source to induce a charge on the surface of the wafer to be etched. The charge on the wafer provides an electrostatic force that pulls the wafer onto the clamping disk. As opposed to mechanical clamping, an electrostatic clamping mechanism increases a surface area of the wafer available for etching.

The clamping disk also includes a cooling mechanism for cooling a back side of the wafer during the DRIE etching process. The cooling mechanism provides helium gas which flows through channels in the clamping disk to the back side of the wafer. Helium gas serves as a heat transfer medium between the wafer and the clamping disk.

If DRIE etching of the wafers is used to form slots or holes (hereinafter and in the claims referred to collectively as "slots") through a thickness of the wafers, an etch stop material must be used on the back side of the wafers to protect the clamping disk from an etching plasma generated during the DRIE process and to prevent escape of helium gas used to cool the back side of the wafers. The escape of helium gas can cause inadequate cooling of the wafers during the etching process, and/or the wafers may be pushed off of the clamping disk by an increase in helium pressure to compensate for helium gas escape.

Various etch stop materials may be applied to the back side of the wafers to protect the clamping disk from damage and to prevent the escape of helium gas. Of the etch stop materials that may be used, relatively hard etch stop materials provide the best protection for the clamping disk. However, relatively hard etch stop materials are difficult to completely remove from the back side of the wafers once the etching process is complete.

Relatively, soft etch stop materials, such as photoresist polymers, are easier to remove from the back side of the wafers. However, under etching conditions, degradation products or a film residue from the relatively soft etch stop materials may accumulate on the clamping disk making it difficult to adequately clamp and seal the wafers on the clamping disk. The residue may also interfere with the flow of cooling gas to the back side of the wafers and may reduce thermal conduction between the wafers and the clamping disk. Removal of the residue may require significant downtime for the etching system thereby reducing product yield. Accordingly, improved methods for DRIE etching of wafers are needed to improve product yield and reduce problems associated with use of apparatus for DRIE etching of wafers.

With regard to the foregoing, the disclosure provides a process for etching semiconductor substrates (such as those in wafer form) using a deep reactive ion etching process to produce slots in the substrates. The process includes applying a first layer to a back side of a substrate as a first etch stop material. The first layer is a relatively soft etch stop material. A second layer is applied to the first layer on the back side of the substrate to provide a composite etch stop layer. The second layer is a relatively hard etch stop material. The substrate is etched from a side opposite the back side of the substrate to provide a slot in the substrates.

Advantages of the embodiments described herein can include the ability to easily remove substantially all of the etch stop materials from the back side of the wafers once the etching process is complete. Another advantage can be that the exemplary composite etch stop materials described herein have increased resistance to residue formation on the clamping disk thereby reducing interference in the flow of cooling gas to the back side of the wafers and improving a seal between the wafers and the clamping disk.

BRIEF DESCRIPTION OF THE DRAWINGS

Further features and advantages of the disclosed embodiments will become apparent by reference to the detailed description when considered in conjunction with the figures, which are not to scale, wherein like reference numbers indicate like elements through the several views, and wherein:

FIGS. 3A-3C are schematic diagrams of a dry etching process;

FIG. 4 is a cross-sectional view, not to scale, of a slot made in a substrate by a dry etching process;

FIGS. 5A-5G are schematic diagrams for a dry etching process according to embodiments of the disclosure;

FIG. 6 is a plan view, not to scale, of a portion of a micro-fluid ejection head; and FIG. 7 is a cross-sectional view, not to scale, of a portion of the micro-fluid ejection head of FIG. 6.

DETAILED DESCRIPTION OF EXEMPLARY EMBODIMENTS

A process for etching slots through a thickness of a wafer of a semiconductor substrate includes a dry etching process using a series of sequential steps of alternating etching and passivation, herein after referred to as "deep reactive ion etching (DRIE)". Such dry etching techniques are described in U.S. Pat. Nos. 5,611,888 and 5,626,716 to Bosch et al., the disclosures of which are incorporated herein by reference.

Figure 1:
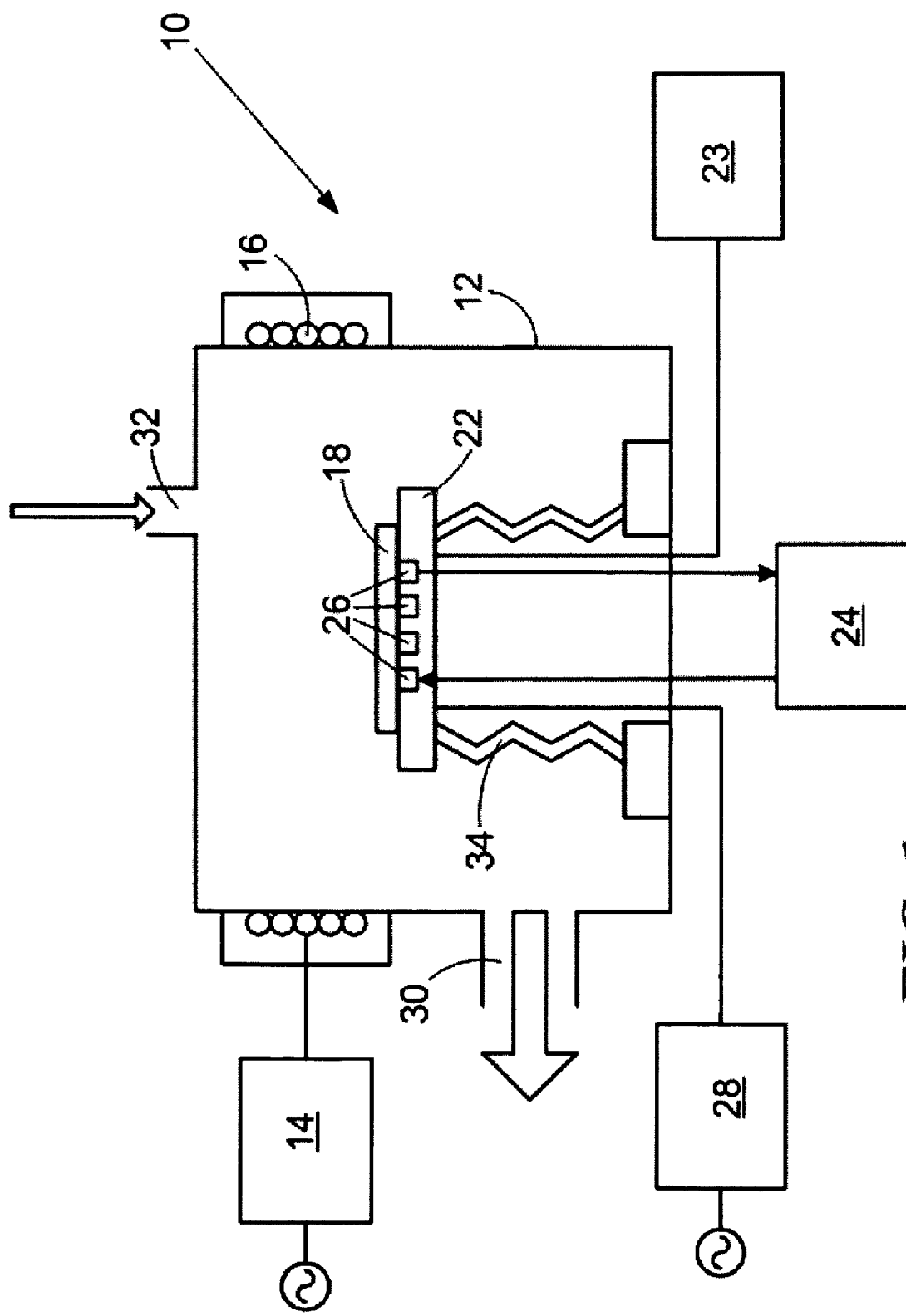
FIG. 1 is a schematic diagram of a deep reactive ion etching system.
Figure 2:
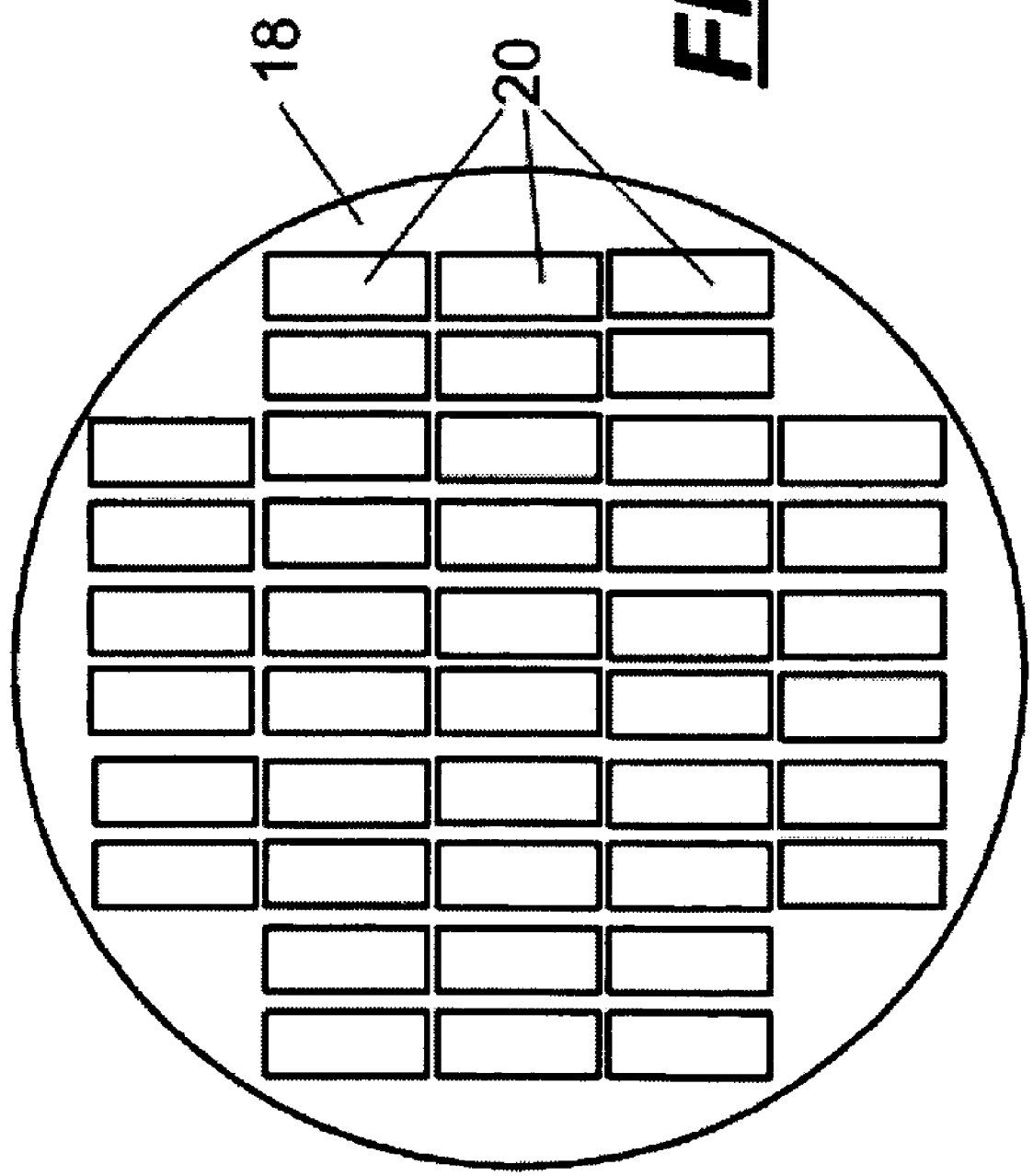
FIG. 2 is a plan view, not to scale, of a wafer containing a plurality of semiconductor substrates.

A schematic diagram of a DRIE system 10 is illustrated in FIG. 1. The system 10 includes a ceramic reaction chamber 12 and a radio frequency (rf) unit 14 for providing source power to a coil 16 to generate a plasma in the reaction chamber 12. A wafer of semiconductor substrate 18 for providing a plurality of semiconductor substrates 20 (FIG. 2) is disposed in the chamber 12 on a temperature controlled clamping disk 22. A direct current (DC) power unit 23 provides an electrostatic clamping force for holding the wafer on the clamping disk 22.

The temperature of a back side of the wafer 18 adjacent the clamping disk 22 is controlled by a refrigeration unit 24 which provides heat removal from helium gas flowing through gas flow channels 26 on a surface of the clamping disk 22. A clamping disk power unit 28 provides rf biasing power to the clamping disk 22 during the etching process.

The chamber 12 is maintained at a subatmospheric pressure during etching by a vacuum pumping unit coupled to a vacuum port 30. A reactive gas is introduced into the chamber through a gas inlet port 32. A bellows system 34 provides a gas tight seal arrangement for the chamber 12 so that a height of the clamping disk 22 may be adjusted during the etching process.

During the etching process for etching wafers 18, the system 10 provides electromagnetic energy to gaseous species within the chamber 12 by applying power to the rf coil 16 wrapped around a dielectric portion of the chamber 12. As current oscillates in the coil 16 very little power dissipation is realized prior to plasma ignition resulting in an ever increasing floating potential difference across the coil 16. The potential difference across the coil 16 provides capacitive coupling of the coil to the dielectric portion of the chamber 12 resulting in an electric field. Eventually the floating potential difference reaches a threshold limit. At the threshold limit, voltage breakdown occurs rendering an ionic mixture including radicals, electrons and emitted photons from a previously neutral gas. The ionic mixture is a luminescent gas generally called a plasma.

Any gas, under the right conditions will form a plasma. However gases used in etching or deposition are chosen strategically to affect particular substrates in a prescribed manner. For example, conventionally, silicon etching is primarily accomplished in the presence of fluorine or fluorine evolving gases such as sulfur hexafluoride ($SF_6$). Sulfur hexafluoride undergoes ionization according to the following reaction:

$$SF_6 + e^- \rightarrow S_xF_y^+ + S_xF_y^* + F^* + e^- \quad (1)$$

thereby producing the reactive fluorine radicals which react with silicon according to the following reaction:

$$Si + F^* \rightarrow SiF_x \quad (2)$$

to produce a volatile gas. A reaction of the fluorine radicals with silicon isotropically etches the silicon.

Isotropic etching, however, is geometrically limited. To produce high aspect ratio features in a silicon substrate with predominantly vertical walls, a directional or anisotropic etch is required. In order to produce vertical walls, the (DRIE) process is used. The DRIE process includes alternating etching and passivating cycles as shown in FIGS. 3A-3C wherein a fluorocarbon polymer ($nCF_2$) is generated to provide a passivating layer 36 during the passivating cycles of the process. In one embodiment, cycling times for each step range from about 3 to about 20 seconds. The fluorocarbon polymer is derived from a compound such as octofluorobutane ($C_4F_8$) according to the following reactions:

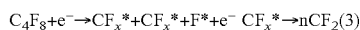
$$C_4F_8 + e^- \rightarrow CF_x^* + CF_x^* + F^* + e^- \ CF_x^* \rightarrow nCF_2 (3)$$

Prior to etching a wafer of semiconductor substrate 18, an etch mask 38 (FIGS. 3A-3C) is applied to the wafer 18 to provide a location for slots 40 in the wafer 18. A process for etching a silicon substrate wafer 18 to form slots 40 therein is described in U.S. Pat. No. 6,402,301 to Powers et al., the disclosure of which is incorporated herein by reference.

During a passivating step of the process, a $C_4F_8$ gas is introduced into the chamber 12 and a plasma is generated under conditions that enable the fluorocarbon polymer to condense on exposed surfaces of the wafer 18 including on side wall surfaces 42 and bottom surface 44 to provide the passivation layer 36 (FIG. 3A). Immediately following the passivating step, the $C_4F_8$ is evacuated from the chamber 12 and replaced with a reactive etching gas $SF_6$ which forms a reactive plasma under the influence of new, and often radically, different operating conditions (FIG. 3B). As a rule of thumb, for instance, little or no power is applied to the clamping disk 22 during the passivating step as the general intent during this step is to promote condensation of the fluorocarbon polymer uniformly on the side wall surfaces 42 and bottom surface 44 of the wafer 18. Increasing the clamping disk power may reduce condensation of the fluorocarbon polymer on the bottom surface 44 of the wafer 18.

For the etching step of the process, the clamping disk power is increased to promote removal of passivation species from the bottom surface 44 of the forming slot 40. Ions or charged species are influenced by electromagnetic fields with their trajectories substantially tangentially directed along field lines. Because the pertinent field lines are substantially perpendicular to the bottom surface 44 of the developing slots 40, and because passivation removal is generally a line of sight phenomena with areas perpendicular to the side walls 42 receiving a disproportionate share of the ionic bombardment, the passivation layer 36 is removed from the bottom surface 44 of the slot 40 at a much higher rate than from the side walls 42. As a result, the etching rate of the bottom surface 44 is significantly higher than the passivated side walls surfaces 42.

While fluorocarbon polymerization during passivation and disproportionate ionic bombardment at the bottom surface 44 of the slot 40 result in etch directionality, it is the fluorine radical species that is responsible for the actual etching of the wafer 18 (FIG. 3C). Radicals species are naturally evolved in plasma chemistries produced in accordance with equation (1) and, in contrast to ions, are typically unaffected by electromagnetic fields with their propagation to the bottom surface 44 driven purely by diffusion. Upon arriving at the bare bottom surface 44 not protected by passivation, radicals spontaneously etch silicon according to equation (2). Therefore etch directionality is a consequence of strategically incomplete passivation removal.

It will be appreciated that the result of each etching cycle is an isotropic etch of the wafer 18. However since the cycle time between the etching and passivating steps is kept relatively short the resulting fluid feed slot 40 has substantially vertical side walls 42 as illustrated by the wafer 18 in FIG. 4. Generally, the smaller the etch step to passivation step ratio and the shorter the overall individual process step cycle time, the more vertical will be the side walls 42 of the slot 40. However, this is an over-simplification of a very complex process. In actuality the geometry of slot 40 is a function of numerous parameters many of which vary non-linearly.

In order to locate and precisely etch features into a substrate such as the silicon wafer 18 using a dry etch process as described above, the etch mask 38 is used to define the areas to be etched. Since the plasma will etch any exposed substrate 18, specifically desired regions in the etch mask 38 should be opened while protecting the remaining areas of the substrate 18. During the etching process, the etch mask 38 will be etched as well as the substrate 18, but at a slower rate. A suitable etch mask material is resistant and thick enough to withstand the entirety of the plasma etching process for the wafer 18.

Typically, there are two main categories of etch masks 38, hard masks and photoresist masks. Hard masks, typically include dielectrics such as silicon oxides, nitrides, and carbides. Such materials are excellent mask materials, however, these materials must first be applied or grown onto the substrate 18 and subsequently patterned to define the region to be dry etched. In some cases, any remaining hard mask must be removed at the termination of the etching process. Removing the hard mask can be time consuming and difficult.

On the other hand, photoresist materials may be applied to the substrate 18 to provide the etch masks 38 by, for example, spinning a thin layer of photo-sensitive polymer onto the substrate 18. After baking the substrate to drive off excess solvents, the resist mask 38 can be exposed to ultra violet (UV) light through a glass and chrome mask. The glass and chrome mask has the pattern to be transferred to the resist mask 38 made by the chrome and clear regions of the glass and chrome mask. The chrome areas of the mask block the UV light and the clear areas of the mask allow the UV light to be transmitted to the resist mask 38. The UV light causes a reaction in the resist mask 38 and, in the case of negative tone resists, the UV light cross-links the material rendering it insoluble to developer. In the case of positive tone resists, the UV light renders the resist mask 38 soluble in an aqueous base developer. After etching the substrate 18 to form slots 40, the remaining photoresist mask 38 may be removed by solvent or by ashing in oxygen plasma.

A wafer 18 containing an etch mask 46 is illustrated in FIG. 5A. The etch mask 46 is applied to a device layer 48 on a surface 50 of the wafer 18 to protect the device layer 48 during the etching process. In an alternative embodiment, a planarization layer may be interposed between the device layer 48 and the etch mask 46. The device layer 48 may include a plurality of conductive, insulative, resistive, and protective layers, generally as may be found in semiconductor substrates used for ink jet printing applications.

Prior to loading the wafer 18 containing the device layer 48 and the etch mask 46 into the dry etch chamber, an etch stop mask is applied to an opposite side 52 of the wafer 18. According to embodiments of the disclosure, the etch stop mask includes a composite mask made of relatively hard and relatively soft materials. The composite etch stop mask may include, but is not limited to, a spin on material such as a photoresist or other polymer, dielectrics, including silicon oxide, silicon nitride, and silicon carbide, and a wafer processing tape. Regardless of the composite etch stop material used, in an exemplary embodiment, the etch stop material should leave substantially no residue on the clamping disk 22. Residue from the composite etch stop material may make it difficult to clamp and seal subsequent wafers 18 onto the clamping disk 22 and may adversely affect the cooling capability of the clamping disk 22 as described above.

Ideally, a material that leaves substantially no residue on the clamping disk 22 such as a highly cross-linked negative photoresist material is used as the etch stop layer. However, such a highly cross-linked negative photoresist material hampers the stripping ability of the etch stop layer from the wafer 18 once the etching process is complete. For example, removal of a highly cross-linked negative photoresist material requires the use of solvents such hot N-methyl pyrrolidone. However, such aggressive solvents may result in the undesirable removal of the planarization layer, if any, used on the device surface 48 of the wafer 18.

A typical dry etching process in the microfabrication field uses only one etch stop material, either a soft etch stop material such as a polymeric material, or hard etch stop material such as silicon dioxide. However, characteristics which enable easy removal of the etch stop material are diametrically opposed to characteristics which prevent transfer of residue from the etch stop mask to the clamping disk 22. Accordingly, the composite etch stop material described below, combines the most favorable characteristics of both types of etch stop materials, that is, an ability to easily remove the etch stop material from the wafer 18 while at the same time being resistant to leaving residue on the surface of the clamping disk 22.

Given the competing characteristics of a suitable etch stop material, the disclosure provides at least two-layers of etch stop material (hereinafter and in the claims referred to as a "composite etch stop material"). The composite etch stop material may include, for example: (1) a relatively soft liftoff or release layer as a first layer and a hardcoat layer as a second layer, (2) a liftoff or release layer made of a strippable polymeric material as a first layer and a highly cross-linked polymer layer as a second layer, or (3) a liftoff or release layer as a first layer and a wafer processing tape as a second layer. In the embodiments (1), (2), and (3), the first layer is adjacent the opposite side 52 of the wafer 18 and the second layer is adjacent the first layer between the first layer and the clamping disk 22. In an exemplary embodiment, the composite etch stop material may enhance the removability of the etch stop material from the wafer 18 while at the same time reduce or eliminate the formation of undesirable residue on the clamping disk 22.

In a first embodiment, a readily soluble polymeric material such as a positive photoresist material, a polyhydroxy styrene material, a low molecular weight epoxy material, a styrene material, or an acrylate material is coated onto the opposite side 52 of the wafer 18 to serve as the relative soft etch stop layer 54 as shown in FIG. 5B. The soft etch stop layer 54 may be applied by a spin-coat process, a spray coat process, or a lamination process. Next, a hardcoat layer is 56 applied to the soft etch stop layer 54, such as by a method selected from sputtering, chemical vapor deposition (CVD), and spin on coating as shown in FIG. 5C. The hardcoat layer may be selected from, for example, silicon oxide, silicon nitride, silicon carbide or a combination thereof, diamond like carbon (DLC), a metal, a fluoropolymer passivation material deposited in a plasma chamber, for example, plasma deposition using octafluorocyclobutane as the monomer gas. The composite etch stop material 54/56 may be easily stripped from the surface 52 of the wafer 18 after forming a slot in the wafer 18 as described in more detail below.

In another embodiment, two polymeric layers are used as the etch stop layers 54 and 56. In this embodiment, a highly cross-linked epoxy resin is used as a hardcoat layer 56 and a readily soluble polymeric material such as a positive photoresist material, a polyhydroxy styrene material, a low molecular weight epoxy material, a styrene material, or an acrylate material is used as layer 54 to provide the composite etch stop material 54/56. Acetophenone may be used as a solvent for the epoxy resin and either acetophenone or propylene glycol methyl ether acetate (PGMEA) may be used as a solvent for the readily soluble polymeric material for spin coating these materials onto the wafer 18. The weight percent solids in these polymer solutions can range from about 10 wt. % to about 50 wt. %. In addition to the solvent, the epoxy resin formulation may contain from about 0.5 to about 2 wt. % of a conventional UV-curing agent such as a mixture of triarylsulfonium hexafluoroantimonate salt, commercially available from Union Carbide Corporation of Danbury, Conn. under the trade name CYRACURE UVI-6974.

In the second embodiment, the readily soluble polymeric material is coated onto the wafer 18 first to serve as a soft etch stop layer 54 while the highly cross-linked epoxy resin is coated onto the soft etch stop layer 54 to provide a hard etch stop layer 56. The thickness of the composite etch stop material 54/56 is controlled by controlling the weight percent solids in each of the polymer solutions as well as the spin coating speed used to apply the polymeric coatings to the surface 52 of the wafer 18 or to the soft etch stop layer 54. Typically, the composite etch stop material 54/56 will have an overall thickness T ranging from about 10 to about 25 microns with the soft etch stop layer 54 having a thickness ranging from about 5 to about 20 microns and the hard etch stop layer having a thickness ranging from about 1 to about 3 microns). In the alternative, the layers 54 and 56 may be selected from other negative or positive photoresist materials applied in a similar manner to the wafer 18.

In yet another embodiment, a tape-based etch-stop material may be used as layer 56 with a soft etch stop material as layer 54. In this embodiment, a readily soluble polymeric material such as a positive photoresist material, a polyhydroxy styrene material, a low molecular weight epoxy material, a styrene material, or an acrylate material is coated onto the wafer 18 by a spin-coat, spray-coat or lamination process to provide the first etch stop layer 54 as describe above in the second embodiment. A wafer processing tape is then applied to the first etch stop layer 54 to provide a hard etch stop layer 56.

A suitable wafer processing tape has a thickness ranging from about 30 to about 100 microns, is resistant to the DRIE process, generates little or no residue under DRIE etching conditions, and is easy to remove after completing the DRIE process. In one embodiment, the tape may be a UV or heat activated release tape for easy removal from the first etch stop layer 54 after the DRIE process is complete. In the alterative, a wafer processing tape containing a low tack adhesive may be used as the hard etch stop layer 56. Examples of wafer processing tapes which may be used include, but are not limited to, wafer processing tapes available from Semiconductor Tapes and Materials, Inc. of San Jose, Calif. under the trade names DT-UV-203 and DT-UV-211, polyester tapes available from 3M Company of St. Paul, Minn. under the trade name designations 336, 1614, and 1675, and tapes available from A. I. Technology, Inc. of Princeton Junction, N.J. under the trade name designations UVR-200 and UVR-500.

An advantage of the composite etch stop layer 54/56 using a readily soluble polymeric material as a soft etch stop layer 54 and a wafer processing tape as a hard etch stop layer 56 can include being able to use a wider variety of adhesives for the tapes (e.g., since the adhesive on the tape does not have to possess etch stop properties because of the presence of etch stop layer 54). Also, any adhesive residue generated during the etching process will be attached to the etch stop layer 54 which is subsequently removed from the wafer 18. In the case of UV or heat activated release tapes used for etch stop layer 56, etch stop layer 54 reduces or prevents early release of the tape by reducing or preventing UV or heat activation of the adhesive on the tape 56 when the etching process is almost complete through the thickness of the wafer 18.

Figure 5D:
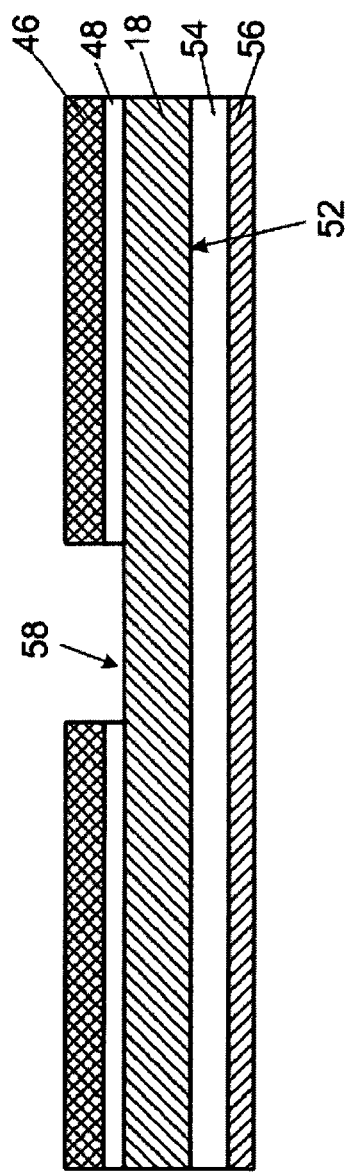
Figure 5E:
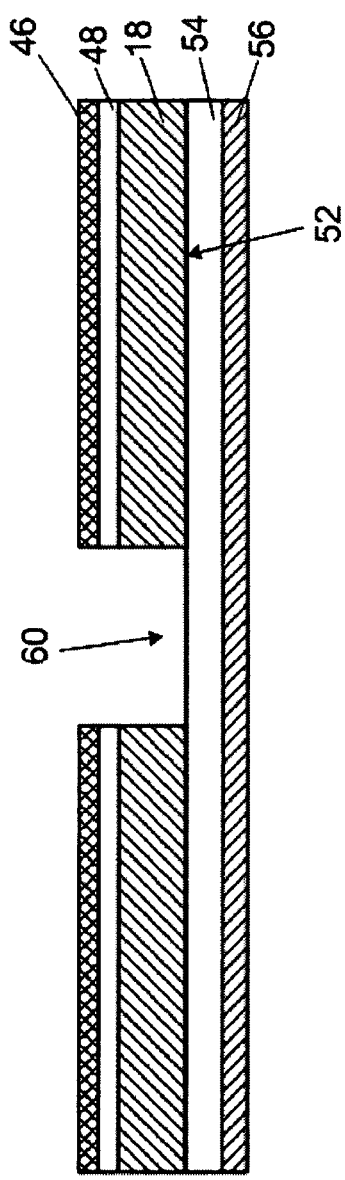
Figure 5F:
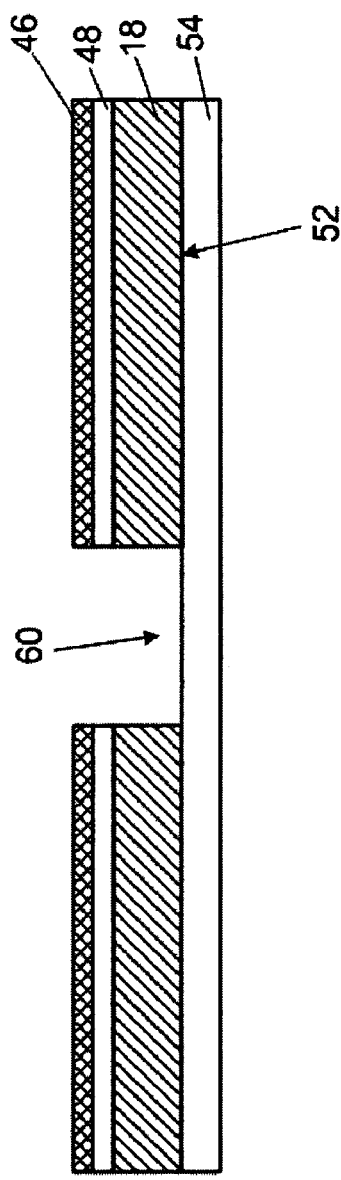

After applying the composite etch stop material 54/56 to the wafer 18, the etch mask 46 is patterned and developed as shown in FIG. 5D to provide a location 58 for a slot 60 (FIG. 5E) to be etched though the wafer 18 up to the composite etch stop material 54/56. After forming the slot 60, the hard etch stop material 56 is removed from the soft etch stop material 54 in the case of a removable wafer processing tape used as the hard etch stop material 56 as shown in FIG. 5F. In the first and second embodiments described above, a solvent may be applied to the soft etch stop layer 54 through the slot 60 to dissolve the soft etch stop layer 54 and provide removal of both the hard and soft etch stop layers 54 and 56 from the wafer 18. Finally, as shown in FIG. 5G, any remaining soft etch stop layer 54 and the etch mask 46 are removed from the wafer 18 using a suitable solvent for the soft etch stop layer 54 and etch mask 46.

Semiconductor substrates 20 (FIG. 2) made from wafers 18 containing slots 60 as shown in FIG. 5G, may be used in a wide variety of applications including micro fluid ejection heads. A plan view of a portion of a micro-fluid ejection head 70 is illustrated in FIG. 6. The ejection head 70 includes a semiconductor substrate 20 and a nozzle plate 72 attached to the substrate 20. The substrate 20 may include a single or multiple fluid feed slots 60. A plurality of ejection devices 74, such as heater resistors are adjacent the slots 60. Upon activation of the ejection devices 74, fluid is ejected through nozzle holes 76 in the nozzle plate 72.

A cross-sectional view, not to scale, of a portion of the micro-fluid ejection head 70 is illustrated in FIG. 7. The substrate 20 includes a plurality of layers 48 defining the plurality of ejection devices 74. The nozzle plate 72 includes nozzle holes 76, a fluid chamber 78 and a fluid supply channel 80, collectively referred to as flow features, in fluid flow communication with the slot 60 for providing fluid to the ejection devices 74. The ejection head 70, as described above, may be used in a fluid ejection device such as an ink jet printer, wherein the fluid ejected is ink. Other micro-fluid ejection devices that may use the ejection head 70, without limitation, may include lubrication ejection heads, cooling ejection heads, and pharmaceutical ejection heads.

Having described various aspects and embodiments of the disclosure and several advantages thereof, it will be recognized by those of ordinary skills that the embodiments are susceptible to various modifications, substitutions and revisions within the spirit and scope of the appended claims.

The invention claimed is:

1. A process for etching silicon wafers using a deep reactive ion etching process to produce through holes or slots in the wafers, the process comprising:
   applying a first layer to a back side of each of the wafers as a first etch stop material, wherein the first layer comprises readily soluble and relatively soft etch stop material;
   applying a second layer to the first layer on the back side of the wafers to provide a composite etch stop layer, wherein the second layer comprises a relatively hard etch stop material; and
   etching the wafers from a side opposite the back side of the wafers to provide one or more through holes or slots in the wafers.

2. The process of claim 1, wherein the first layer has a thickness on the back side of the wafers ranging from about 5 to about 20 microns.

3. The process of claim 1, wherein the second layer is applied by a process selected from the group consisting of sputtering, chemical vapor deposition, spin coating, spray-coating and dry film lamination.

4. The process of claim 1, wherein the second layer comprises an ultra violet light activated wafer processing release tape, further comprising activating the release tape with ultra violet light after the etching step to remove the second layer from the wafers.

5. The process of claim 1, wherein the second layer comprises a heat activated wafer processing release tape, further comprising heating the release tape after the etching step to remove the second layer from the wafers.

6. The process of claim 1, wherein the first layer comprises a material selected from the group consisting of a positive photoresist material, a polyhydroxy styrene material, a low molecular weight epoxy material, a styrene material, and an acrylate material.

7. The process of claim 6, wherein the first layer is applied to the back side of the wafers by a process selected from the group consisting of spin-coating, spray-coating and dry-film lamination.

8. The process of claim 7, wherein the first layer has a thickness on the back side of the wafers ranging from about 5 to about 20 microns.

9. The process of claim 1, wherein the second layer comprises a material selected from the group consisting of silicon oxide, silicon nitride, silicon carbide, diamond-like carbon, a fluoropolymer passivation material, an epoxy resin material, and an adhesive wafer processing tape.

10. The process of claim 9, wherein the second layer is applied by a process selected from the group consisting of sputtering, chemical vapor deposition, spin coating, spray-coating coating and dry film lamination.

11. In a process for etching through holes or slots through a thickness of a silicon wafer using a deep reactive ion etching (DRIE) process, the improvement comprising:
  applying a composite layer to a back side of the wafer adjacent an electrostatic clamping disk, the composite layer comprising a relatively soft first layer adjacent the back side of the wafer, and a relatively hard second layer adjacent the first layer and the clamping disk:
  etching the wafer to provide the holes or slots in the wafer; and
  removing the composite layer from the back side of the wafer upon completion of the etching step.

12. The improvement of claim 11, wherein the composite layer has a thickness on the back side of the wafers ranging from about 10 to about 300 microns.

13. The improvement of claim 11, wherein the second layer is applied by a process selected from the group consisting of sputtering, chemical vapor deposition, spin coating, spray-coating and dry film lamination.

14. The improvement of claim 11, wherein the second layer comprises an ultra violet light activated wafer processing release tape, further comprising activating the release tape with ultra violet light after the etching step to remove the second layer from the wafers.

15. The improvement of claim 11, wherein the second layer comprises a heat activated wafer processing release tape, further comprising heating the release tape after the etching step to remove the second layer from the wafers.

16. The improvement of claim 11, wherein the first layer comprises a readily soluble polymeric material selected from the group consisting a positive photoresist material, a polyhydroxy styrene material, a low molecular weight epoxy material, a styrene material, and an acrylate material.

17. The improvement of claim 16, wherein the first layer is applied to the back side of the wafers by a process selected from the group consisting of spin-coating, spray-coating and dry-film lamination.

18. The improvement of claim 17, wherein the first layer has a thickness on the back side of the wafers ranging from about 5 to about 20 microns.

19. The improvement of claim 11, wherein the second layer comprises a material selected from the group consisting of silicon oxide, silicon nitride, silicon carbide, diamond-like carbon, a fluoropolymer passivation material, an epoxy resin material, and an adhesive wafer processing tape.

20. The improvement of claim 19, wherein the second layer is applied by a process selected from the group consisting of sputtering, chemical vapor deposition, spin coating, spray-coating and dry film lamination.

* * * * *